(12) United States Patent
Harman (10) Patent No.: US 6,856,136 B2
(45) Date of Patent: Feb. 15, 2005

(54) THERMOELECTRIC DEVICE TEST STRUCTURE

(75) Inventor: Theodore C. Harman, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 99 days.

(21) Appl. No.: 10/152,754

(22) Filed: May 22, 2002

(65) Prior Publication Data

US 2003/0218464 A1 Nov. 27, 2003

(51) Int. Cl.[7] .................. G01N 25/00; G01R 31/02; H01L 35/04
(52) U.S. Cl. .................. 324/451; 324/755; 136/205
(58) Field of Search .................. 324/451, 537, 324/719, 755, 447, 515; 136/238, 290, 205, 216; 374/31, 32

(56) References Cited

U.S. PATENT DOCUMENTS

| | | | |
|---|---|---|---|
| 2,994,818 A | * 8/1961 | Harman | 324/451 |
| 3,170,117 A | 2/1965 | Berning et al. | 324/106 |
| 3,213,667 A | * 10/1965 | Gettys | 374/5 |
| 3,667,032 A | * 5/1972 | Summer, Jr. | 324/451 |
| 3,737,762 A | * 6/1973 | Fletcher et al. | 324/451 |
| 3,852,118 A | * 12/1974 | Hampl, Jr. | 136/238 |
| 4,459,428 A | * 7/1984 | Chou | 136/211 |
| 5,017,865 A | 5/1991 | Oldfield | 324/754 |
| 5,550,387 A | * 8/1996 | Elsner et al. | 257/15 |
| 5,723,981 A | * 3/1998 | Hellemans et al. | 324/719 |
| 6,605,772 B2 | * 8/2003 | Harman et al. | 136/236.1 |

OTHER PUBLICATIONS

Wagner et al., Fabrication and Testing of Thermoelectric Thin Film Devices, IEEE, Mar. 26, 1996, pp. 269–273.
Kajikawa T "Status and Future Prospects on the Development of Thermoelectric Power Generation Systems Utilizing Combustion Heat from Municipal Solid Waste", IEEE, Aug. 26, 1997, pp. 28–36.
Copy of International Search Report dated Sep. 19, 2003.

* cited by examiner

Primary Examiner—Anjan K. Deb
(74) Attorney, Agent, or Firm—Daly, Crowley & Mofford, LLP (57) ABSTRACT

A test structure for testing a thick film thermoelectric device is presented. The test structure is able to test the thermoelectric device in the device's three modes of operation, namely as a cooling device, as a heat pump, and as a power generator. The test structure includes a pair of current electrode blocks for supporting and supplying power from a power supply to the thick film thermoelectric device being tested. Thermocouples are attached to different portions of the thick film thermoelectric device to indicate the temperature change across the device as it is being tested. Additionally, a heat source is provided when the device is being tested in an electrical generation mode. The test structure is able to compensate for the expansion and contraction of the thick film thermoelectric device during the testing. By way of the disclosed test structure, the thick film thermoelectric devices can be tested and characterized.

18 Claims, 4 Drawing Sheets

THERMOELECTRIC DEVICE TEST STRUCTURE

STATEMENT REGARDING FEDERALLY SPONSORED RESEARCH

This invention was made with government support under Contract Number F19628-95-C-0002 awarded by the U.S. Air Force. The government has certain rights in the invention.

FIELD OF THE INVENTION

The present invention relates generally to a test structure for testing thermoelectric devices, and more particularly to a test structure for testing thick film thermoelectric devices made of quantum dot materials.

BACKGROUND OF THE INVENTION

As is known in the art, a thermoelectric (TE) material refers to a material capable of directly converting thermal energy into electrical energy and vice versa or capable of cooling a material when a current is flowing in a desired direction through the material. Such materials include, for example, heavily doped semiconductor materials. Thermoelectric devices are fabricated from TE materials and are widely used in microelectronics and in biotechnology. Thermoelectric devices have the potential to replace freon-based air conditioners and refrigeration cooling devices; and to utilize waste heat by converting the heat to electrical power.

TE devices may also be used to convert heat into electrical power. For use in both refrigeration and power generation applications, it is desirable to choose the materials, and their relative amounts, so that the thermoelectric figure of merit, ZT, is maximized.

The dimensionless thermoelectric figure of merit (ZT) is a measure of the effectiveness of the material for both cooling and power conversion applications and is related to materials properties by the following equation:

$$ZT = S^2 \sigma T / K,$$

where S, $\sigma$, K, and T are the Seebeck coefficient, electrical conductivity, thermal conductivity and temperature, respectively. The figure of merit (ZT) is a measure of how readily electrons (or holes) can convert thermal to electrical energy in a temperature gradient as the electrons move across a thermoelement. The highest useful Seebeck coefficients are found in semiconductor materials with a high density of states at the Fermi level and the Fermi level is located near a band edge. In theory, to maximize the thermoelectric figure of merit ZT, one would try to increase or maximize the Seebeck coefficient S, electrical conductivity $\sigma$ and temperature T and minimize the thermal conductivity K. However, in practice, this is not so simple. For example, as a material is doped to increase its electrical conductivity ($\sigma$), bandfilling tends to lower the Seebeck coefficient S and the electronic contribution, $K_e$; the thermal conductivity K increases. At a given temperature, the thermoelectric figure of merit ZT for a given material is maximized at an optimum doping level. In most materials, the thermoelectric figure of merit ZT is maximized at doping levels of approximately $10^{19}$ cm$^{-3}$. Since increasing (or decreasing) one parameter may adversely decrease (or increase) another parameter, it is generally difficult to achieve higher values for ZT. It should of course be appreciated that increasing $\sigma$ increases $K_e$, but decreases S and vice-versa. Currently, the best commercial thermoelectric materials have a maximum ZT of approximately one. The ZT values are below one at temperatures both below and above the temperature at which they achieve the maximum value.

The thermoelectric figure of merit ZT in conventional (bulk) thermoelectric materials is also related to the thermoelectric materials factor (b*) which may be expressed as:

$$b^* = \mu m^{*3/2} / K_L$$

in which:
 $\mu$ is the carrier mobility;
 m* is the density of states effective mass; and
 $K_L$ is the lattice thermal conductivity.

The precise relationship between the thermoelectric materials factor b* and the thermoelectric figure of merit ZT is relatively complex.

Bulk thermoelectric devices are known, and test structures for testing these bulk devices have been designed, however these test structures are unacceptable for testing thick film thermoelectric devices. The bulk device test structures are not able to accept the films. More importantly perhaps, parasitics associated with bulk device test structures are too severe to allow for accurate measurements of thick film thermoelectric devices. By parasitics, we mean thermodynamically irreversible heat flows which act to reduce the amount of cooling possible. Examples of parasitics include, but are not limited to, radiative heat flow from the surroundings, heat flow thermally conducted along the lead wires of the Chr-Alu temperature measurement thermocouples to the cool region of the test structure, and the electrical contact resistance. The relative importance of each of the parasitics changes with the magnitude of the cooling. The test structure suitable for bulk samples are not matched in terms of their thermal, electrical, and geometrical properties. The radiation parasitics are relatively large compared to bulk. Electrical contact resistance can further increase the difficulty of carrying out accurate measurements. The fragile nature of some samples further complicates the testing of the thick film TE material. It would, therefore, be desirable to provide a device test structure which allows accurate testing and characterization of thermoelectric thick film materials and structures.

SUMMARY OF THE INVENTION

A test structure for testing a thick film thermoelectric device is presented. The test structure is able to test the thermoelectric device in the device's three modes of operation, namely as a cooling device, as a heat pump, and as a power generator. The test structure includes a pair of current electrode blocks for supporting and supplying power from a power supply to the thick film thermoelectric device being tested. Thermocouples are attached to different portions of the thick film thermoelectric device to indicate the temperature change across the device as it is being tested. Additionally, a heat source is provided when the device is being tested in a power generation mode. The test structure is able to compensate for the expansion and contraction of the thick film thermoelectric device during the testing. By way of the disclosed test structure, the thick film thermoelectric devices can be accurately tested and characterized. In one embodiment, the test structure includes two blocks which are not physically fixed in any position (i.e. the blocks are allowed to "float"). In another embodiment the blocks are fixed in place and the thermoelectric device is attached to the blocks via a liquid solder connection.

BRIEF DESCRIPTION OF THE DRAWINGS

The invention will be more fully understood from the following detailed description taken in conjunction with the accompanying drawings, in which.

DETAILED DESCRIPTION OF THE INVENTION

Before proceeding with a discussion of the figures, some introductory concepts and terminology are explained. A typical bulk thermoelectric device includes a section of P-type material that is in mechanical and electrical communication with a section of N-type material. The point at which the two materials contact each other is referred to as a "junction". Whenever electrical current flows through two dissimilar materials, depending on the direction of current flow through the materials, the junction of the P-type and N-type material will either absorb or release heat.

When the thermoelectric device is connected to a voltage source such that the P-type material is connected to the positive lead of the voltage source and the N-type material is connected to the negative lead of the voltage source a phenomenon takes place. The negative charge carriers, also known as electrons, in the N-type material are repelled by the negative potential and attracted to the positive potential of the voltage source. Similarly, the positive charge carriers, also known as holes, in the P-type material are repelled by the positive voltage potential and attracted by the negative potential of the voltage source. The charge carriers are carrying heat to the junction of the P-type and N-type material, thus the device is providing a heating function at the junction of the N-type and P-type materials.

Conversely, when the thermoelectric device is connected to a voltage source such that the N-type material is connected to the positive lead of the voltage source and the P-type material is connected to the negative lead of the voltage source, the opposite effect occurs. Charge carriers (electrons) in the N-type material are repelled by the negative potential and attracted to the positive potential of the voltage source. Similarly, the positive charge carriers (holes) in the P-type material are repelled by the positive voltage potential and attracted by the negative potential of the voltage source. The charge carriers are carrying heat away from the junction of the p-type and n-type material, thus the device is providing a cooling function at the junction of the P-type and N-type materials.

Given the pairing of N-type material with P-type material, it is common to believe that thermoelectric devices will function in a manner similar to a diode. However, this is not the case, since in a diode a depletion region is formed between the P-type material and the N-type material. When the diode is forward biased, charge carriers are drawn into the depletion region and the diode becomes conductive. When the diode is reverse biased charge carriers are drawn away from the depletion region and the diode acts as an open circuit. The thermoelectric device does not form a depletion region and therefore does not function in a manner similar to a diode. The thermoelectric device conducts in both directions and there is no voltage drop across the device.

While bulk type thermoelectric devices have proven useful, recent evaluations have produced evidence that thick film versions of thermoelectric devices, while having similar modes of operation, will provide higher thermoelectric figures of merit than conventional bulk type thermoelectric devices. Additionally, the thick film thermoelectric devices will be able to be fabricated in a manner which is similar to the manner in which ultrahigh density integrated circuits are formed now.

In order to properly test these types of thick film thermoelectric devices, a test structure was designed. The test structure had to take into account several characteristics of the thermoelectric device being tested.

It should also be appreciated that reference is made herein below to thermoelectric devices having particular characteristics, e.g. devices fabricated from a particular materials system, or devices which include a particular number of layers, or dopant types, etc. Such references should not be considered as limiting but rather is included only to provide clarity in the below description.

Figure 1:
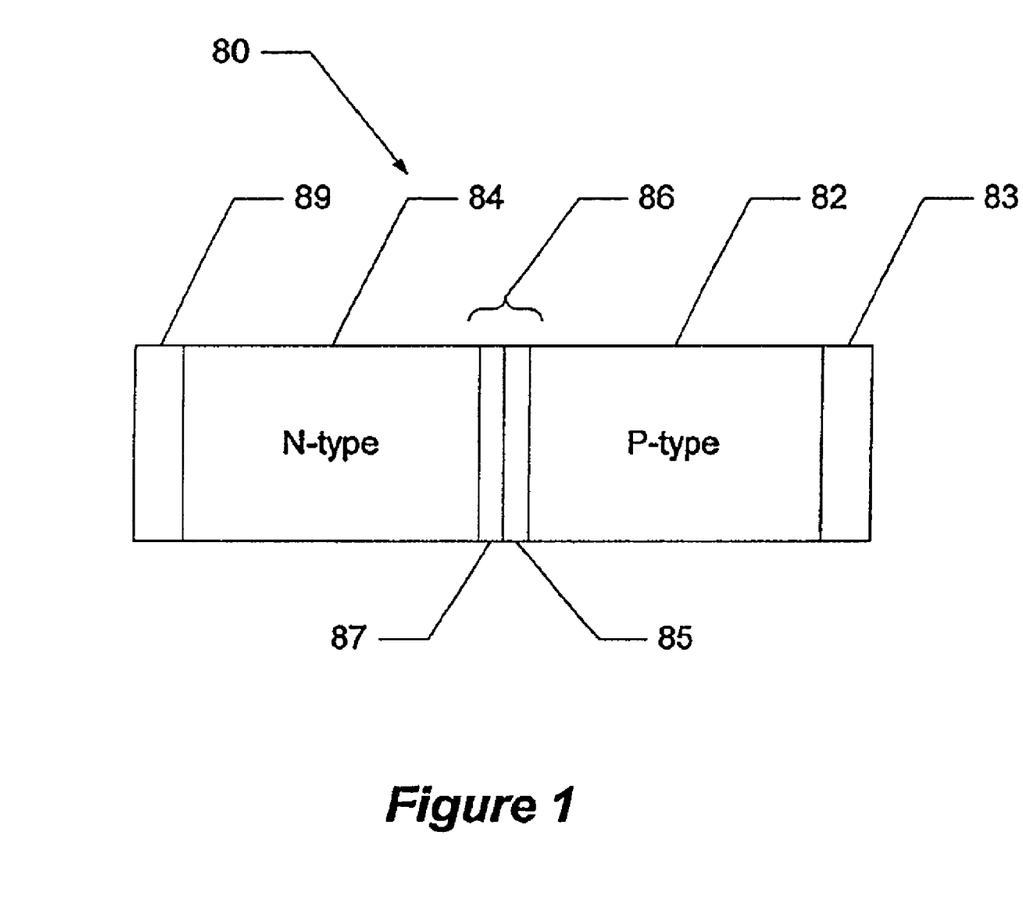
FIG. 1 is a diagram of a thick film thermoelectric device.

Referring now to FIG. 1, a thick film thermoelectric device 80 is shown. The thermoelectric device includes a P-type material portion 82 and an N-type material portion 84. The P-type material portion comprises a Pb-salt quantum dot (QD) material such as PbTe/PbSe superlattices doped with TlSe. The P-type material 82 comprises approximately 9,900 layers, with each two layers having approximately $10^{11}$ dots per $cm^2$. The overall thickness of the P-type material is approximately 100 $\mu$m. The P-type material is typically grown on a substrate by techniques which are known in the art.

Similarly, the N-type material 84 of the thermoelectric device 80 comprises a Pb-salt quantum dot QD superlattice doped with a material such as $Bi_2Te_3$. The N-type section 84 also comprises approximately 9,900 layers, with each layer having approximately $10^{11}$ dots per $cm^2$, the overall thickness of the N-type material section is approximately 100 $\mu$m. The N-type material is grown over a $BaF_2$ substrate by techniques which are known in the art. The materials, numbers of layers and thicknesses described above for the N-type and P-type material are provided for explanation purposes, and it should be understood that other materials, numbers of layers, and thicknesses could also be used.

Once the N-type and P-type materials have been produced they are cleaved to a desired size. It is desirable to provide dimensionally matched N-type section and P-type section in order to provide equal performance from each portion of the thermoelectric device. It is desirable to provide a large aspect ratio for each section of material in order for the section to pump a large amount of heat. The aspect ratio is computed as A/L, where A is equal to the cross-sectional area of the section (width×thickness) and L is equal to the length of the section. The length L cannot be chosen to be too long, as a long length will result in such a small heat pumping capacity that parasitics will overwhelm the effect. On the other hand, if the length L is too short, then the contact resistance $\rho_c$ will be too large and will degrade the performance of the device. A targeted contact resistivity of less than $2 \times 10^{-4}$ ohm/$cm^2$ at 300K is desired.

Once the P-type section and N-type section have been cleaved to the same desired size, the ends of each portion must be metallized. The metallization is done to obtain the highly desirable low contact resistance. As an oxide begins to form on the cleaved ends immediately after cleaving which can prevent a low contact resistance connection, the metallization should be done as soon as possible after the cleaving and I a glove box containing an inert atmosphere. The metallized ends are shown as ends 83 and 85 for the P-type section 82, and as ends 87 and 89 for the N-type section 84.

Once the metallization has been done, it is necessary to remove the substrate the N-type section and the P-type section were formed on, as the substrate would thermally short out a test structure. One convenient method to remove the substrate is to dissolve the substrate in an etching solution. Other techniques to remove the substrate from the thick film could also be used. The remaining film is fragile, as there is no longer a substrate to support it.

Once the substrate has been removed from each section, the sections are joined together. The metallized end 85 of the P-type portion 82 is joined with the metallized end 87 of N-type section 84 by soldering. The solder used is a BiSn solder, although other solder or other methods of attaching the two sections together could also be used.

Having prepared the thermoelectric device for testing, the test device itself will now be described.

Figure 2:
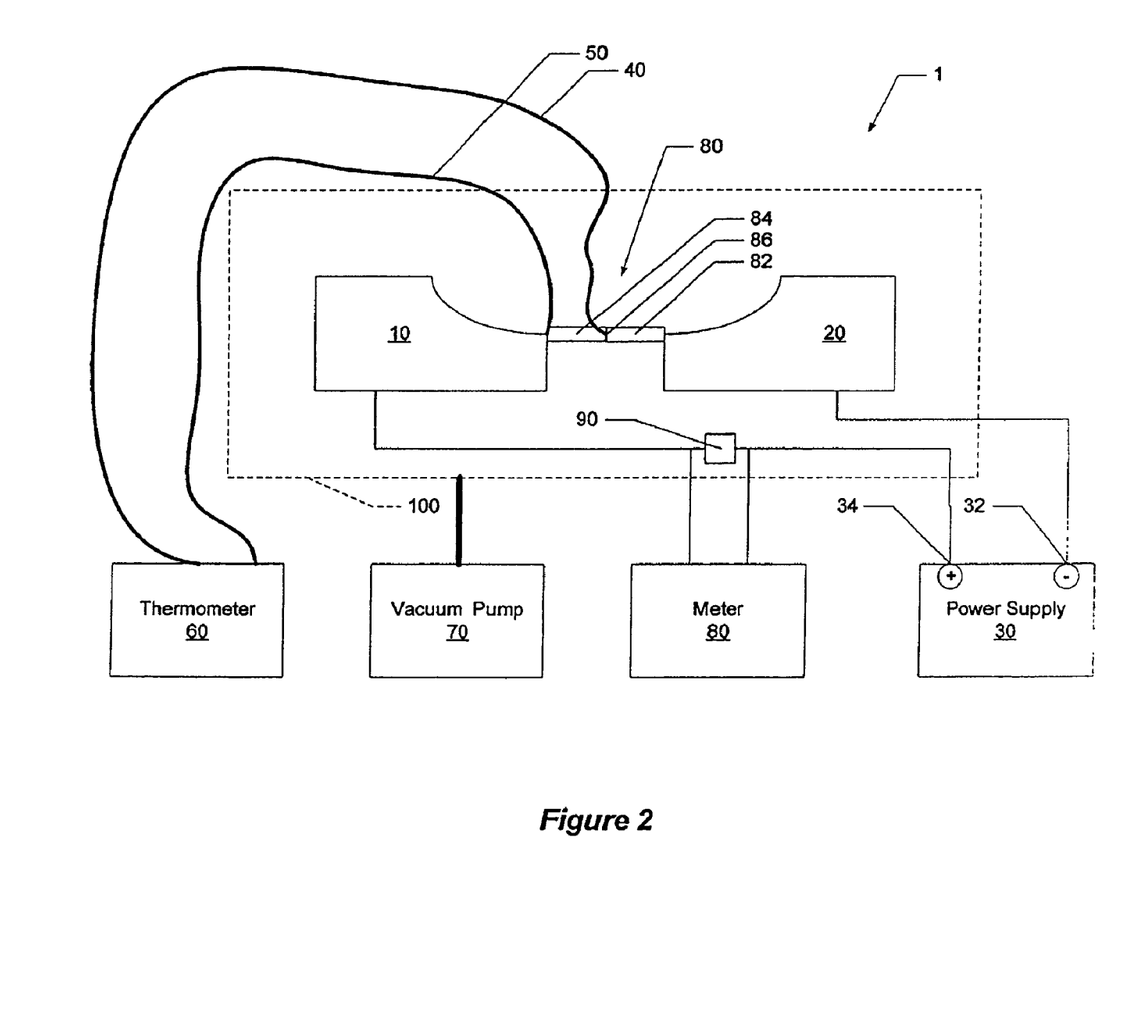
FIG. 2 is a block diagram of a test structure for testing the thermoelectric device in a cooling mode.

Referring now to FIG. 2, the test structure 1 for testing a thermoelectric thick film device 80 is shown. The test structure includes a first current electrode block 10 and a second current electrode block 20. The two current electrode blocks 10 and 20 are used to support the thermoelectric device being tested and to provide power to the thermoelectric device being tested. The current electrode blocks are preferably comprised of copper due to coppers low electrical resistance and high thermal conductivity, and may be gold plated to prevent oxidation and provide a material that is easily soldered to. Other materials having suitable electrical, mechanical and thermal characteristics may, of course, also be used. Since the thermoelectric device is fragile (no substrate to support it) and because the thermoelectric device will expand and/or contract depending on how the device is tested (e.g. expansion when used as a heat source, contraction when used as a cooler), the current electrode blocks need to accommodate both the fragile nature of the device and the thermal contraction/expansion of the device. This can be done in several ways.

A first method of supporting the device and taking into account the thermal considerations necessary when testing the device is to have the current electrode blocks 10 and 20 mechanically and electrically attached to the device being tested. This may be accomplished by soldering the ends 83 and 89 of the thermoelectric device to the current electrode blocks 10 and 20. While this provides mechanical support for the device, the thermal expansion/contraction must also be taken care of; otherwise the film will fracture. Therefore, the current electrode blocks are not physically fixed into position, but are slidable along a generally horizontal axis to allow the current electrode blocks to move with the thermal expansion and/or contraction of the device under test. The electrode blocks are placed inside bigger slotted copper blocks. Other techniques for allowing the blocks to move while testing the thermoelectric device can also be used. By providing a mechanism for the current electrode blocks to move with the thermoelectric device during expansion and/ or contraction, the film can be tested and characterized without being damaged.

A second technique for supporting the device and taking into account the thermal considerations necessary when testing the device is to have the current electrode blocks fixed in place and yieldably attached to the thermoelectric device being tested. This is accomplished by using a liquid solder to attach the device under test 80 to the current electrode blocks 10 and 20. The liquid solder connection allows the device to move as it contracts and expands while still maintaining electrical contact between the thermoelectric device and the current electrode blocks which are mechanically fixed in place. In this manner, the connections between the thermoelectric film and the current electrode blocks compensate for the expansion or contraction of the thermoelectric device during testing, and the device can be tested without being damaged.

A power supply 30 is used to provide a voltage between the current electrode blocks 10 and 20. The power supplied by power supply 30 may also be in electrical communication with a voltmeter 80 having a precision series resistor 90 disposed between the leads of the voltmeter. This is useful in measuring the current as part of the testing of the thermoelectric device.

A first thermocouple 40 is shown connected to the area of the device under test where the P-type section 82 of the thermoelectric device 80 is joined with the N-type section 84, also known as the cold junction region 86. The first thermocouple 40 is in communication with thermometer 60. While thermocouples are shown and described, it should be appreciated that any known device for measuring temperature could be used.

A second thermocouple 50 is shown connected to an end of the device under test 80, this area is known as the hot-junction area. The second thermocouple could be connected to either end of the thermoelectric device, as both of these ends are referred to as hot-junction areas. This second thermocouple is also in communication with thermometer 80. Thermometer 80 is used to provide a temperature reading across the device under test. In a preferred embodiment the thermocouples comprise 5-mil DiaChromel wire and 5-mil Alumel wire.

A vacuum pump 70 is shown which is used to provide a vacuum within enclosure 100, which surrounds the current electrode blocks 10 and 20, and the device under test 80. The vacuum pump is used to create a vacuum within the enclosure 100, which eliminates thermal convection parasitics that would otherwise affect the accuracy of the testing performed on the device under test 80.

The thermoelectric device 80 being tested can operate in three different modes. The three modes the device can operate are (1) a cooling mode, (2) a heat pump mode, and (3) a power generation mode. The presently disclosed test structure allows the testing of the thermoelectric device in any or all of the three modes.

As shown in FIG. 2, when the device is operating in a cooling mode, the positive terminal 34 of power supply 30 is connected to the N-side of the test structure through current electrode block 10. The negative terminal 32 of power supply 30 is connected to the P side of the test structure through current electrode block 20. The electrons in the N-side of the thermoelectric device are carrying heat from the cold-junction region 86 (middle of the device being tested) to the hot junction region (the distal end of N-type portion 84 of the thermoelectric device). On the P-type side 82 of the device under test 80, the holes are carrying heat from the cold-junction region 86 to the hot junction region (distal end of P-type portion 82 of the thermoelectric device). The thermoelectric device 80 is providing a cooling function, and the amount of cooling provided is measured by the temperature difference between the temperatures sensed by first thermocouple 40 and second thermocouple 50.

Figure 3:
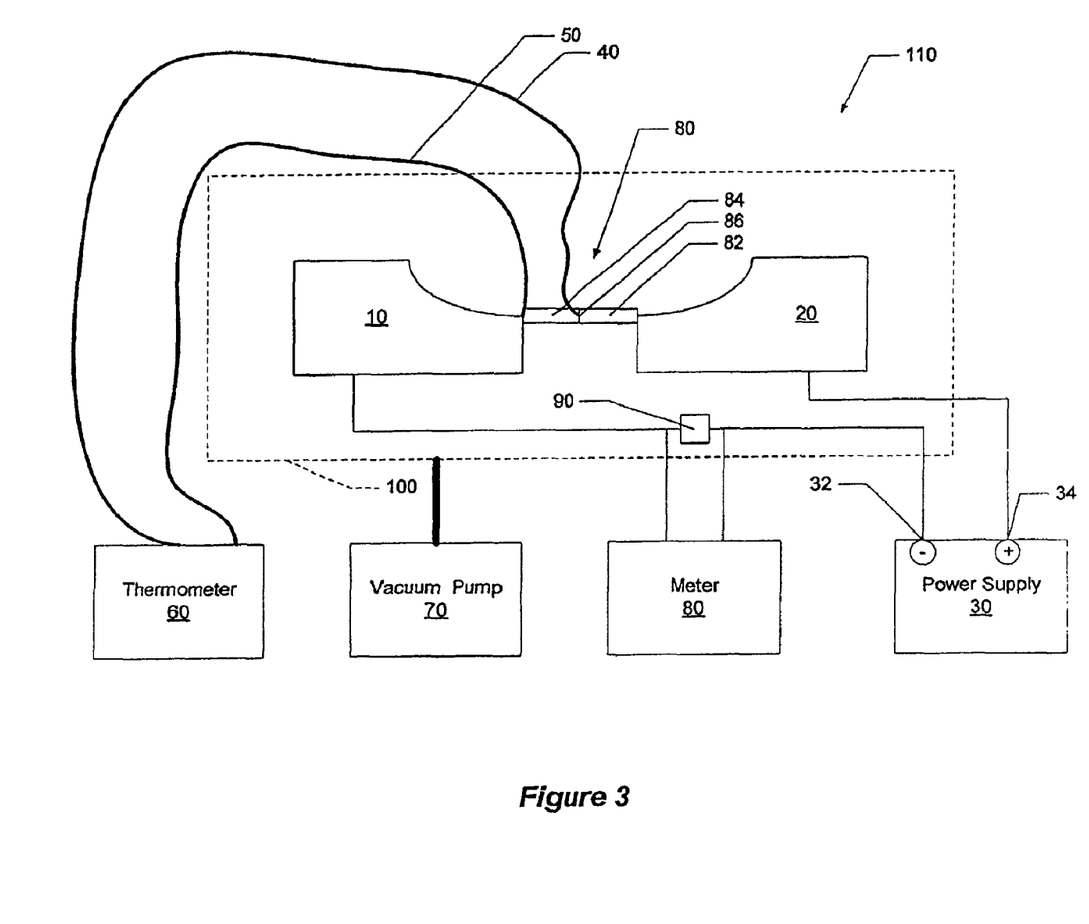
FIG. 3 is a block diagram of a test structure for testing the thermoelectric device in a heat pump mode.

The thermoelectric device can also be tested in a heat pump mode of operation, and the test structure for this mode of operation is shown in FIG. 3. This is the opposite of the cooling mode described above. The current direction is reversed by attaching the positive side 34 of the power supply 30 to the P-side current electrode block 20 and the negative lead 32 of the power supply 30 to the N-side current electrode 10. The electrons in the N-side of the device are carrying heat to the cold-junction region 86 (middle of the device being tested) from the hot junction region (the distal end of N-type portion 84 of the thermoelectric device). On the P-type side 82 of the device under test 80, the holes are carrying heat to the cold-junction region 86 from the hot junction region (distal end of P-type portion 82 of the thermoelectric device). The thermoelectric device 80 is providing a heating function, and the amount of heating provided is measured by the temperature difference between the temperatures sensed by first thermocouple 40 and second thermocouple 50.

Figure 4:
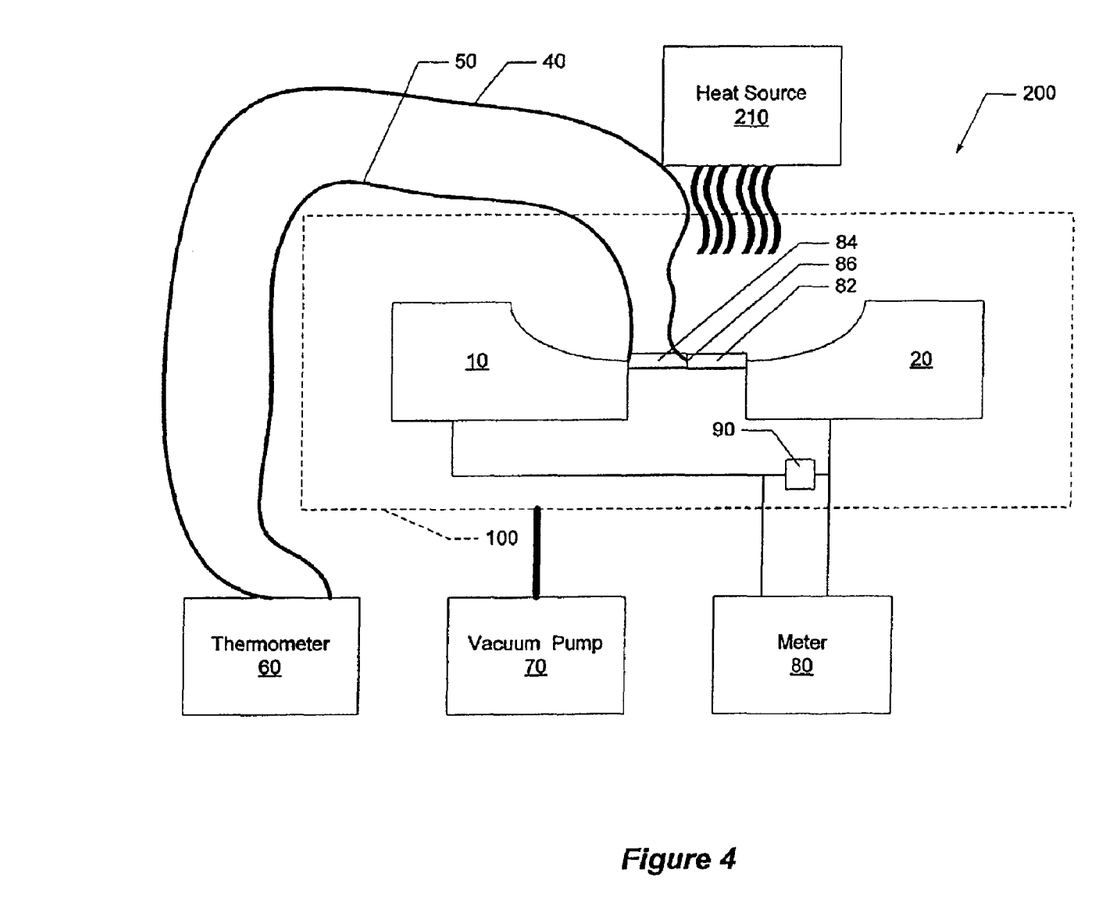
FIG. 4 is a block diagram of a test structure for testing the thermoelectric device in a power generation mode.

Referring now to FIG. 4, the thermoelectric device can further be tested in a power generation mode of operation. There is no voltage source present, as in the other test setups. Instead a heat source 210 is disposed such that the source provides heat to the center junction 86 of the device being tested. If the device is electrically connected, current will flow through the load resistor 90 (a precision resistor). The heat causes current to flow from the cold-junction region 86 (middle of the device being tested) to the hot junction region (the N-type portion 84 of the thermoelectric device). On the P-type side 82 of the device under test 80, the heat is causing current to flow from the cold-junction region to the hot junction region and meter 80 measures a voltage from which the total current generated by the device can be calculated. The heat also causes region 86 to become hotter than the distal ends of 82 and 84. In this configuration, the thermoelectric device is converting heat to electrical energy.

In a further embodiment the test structure is used to test either the n-type section separately or to test the p-type portion separately. In the case where it is desirable to test the n-type section separately from the p-type section, the n-type section has one end coupled to a first current electrode block. The opposite end of the n-type section is coupled to a first end of a preferably p-type wire (e.g. gold wire). The other end of the wire is coupled to the second current electrode block.

Similarly, a p-type section can be tested by coupling a first end of the p-type material to a first current electrode block. The second end of the p-type section is coupled to a first end of an preferably n-type wire. The other end of the wire is coupled to the second current electrode block.

With such an arrangement individual p-type and n-type section can be characterized. The data from the characterization can be used to match together n-type and p-type sections to provide a device having desirable characteristics.

As described above, the presently disclosed test structure is able to test the thermoelectric device in the device's three modes of operation, namely as a cooling device, as a heat pump, and as a power generator. The test structure is able to compensate for the expansion and contraction of the thick film thermoelectric device during the testing and to properly support the device during the testing procedure. By way of the disclosed test structure, the thick film thermoelectric devices can be tested and characterized effectively and efficiently.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims. All publications and references cited herein are expressly incorporated herein by reference in their entirety.

What is claimed is:

1. A test structure for a thermoelectric device comprising:

a first current electrode block supporting a first end of the thermoelectric device and capable of being placed in electrical and thermal communication with a first end of the thermoelectric device and wherein said first current electrode block accounts for thermal expansion and contraction of the thermoelectric device;

a second current electrode block supporting a second end of the thermoelectric device and capable of being placed in electrical and thermal communication with a second end of the thermoelectric device and wherein said second current electrode block accounts for thermal expansion and contraction of the thermoelectric device; and a selected one of a power supply coupled to said first and second current electrode blocks and a heat source disposed to provide heat to the thermoelectric device.

2. The test structure of claim 1 further comprising a vacuum enclosure surrounding said first current electrode block, said second current electrode block and the thermoelectric device.

3. The test structure of claim 1 further comprising a meter coupled to said power supply.

4. The test structure of claim 1 wherein said first current electrode block is spatially displaceable to account for thermal expansion and contraction of the thermoelectric device.

5. The test structure of claim 1 wherein said second current electrode block is movably displaceable to account for thermal expansion and contraction of the thermoelectric device.

6. The test structure of claim 1 wherein said first current electrode block is capable of being placed in thermal communication with said thermoelectric device to be tested by way of a yieldable electrical connection.

7. The test structure of claim 1 wherein said second current electrode block is capable of being placed in thermal communication with said thermoelectric device to be tested by way of a yieldable electrical connection.

8. The test structure of claim 7 wherein the yieldable electrical connection comprise liquid solder.

9. The test structure of claim 6 wherein the yieldable electrical connection comprise liquid solder.

10. The test structure of claim 1 wherein said test structure is provided for testing a thermoelectric device comprising a dimensionally matched P-type material section and N-type material section, wherein both ends of said thermoelectric device have been metallized, and wherein a substrate associated with said thermoelectric device during formation of said thermoelectric device has been removed.

11. The test structure of claim 1 wherein said thermoelectric device comprises a thick film quantum dot superlattice device.

12. The test structure of claim 1 wherein said first current electrode block and said second current electrode block are comprised of copper.

13. The test structure of claim 12 wherein at least a portion of said first current electrode block and said second current electrode block are gold plated.

14. The test structure of claim 1 wherein said structure is operative to test the thermoelectric device in at least one of a cooling mode of operation wherein said power supply is configured such that a positive lead of the power supply is coupled to said first current electrode block and a negative lead of said power supply is coupled to said second current electrode block, a heat pump mode of operation wherein said power supply is configured such that a positive lead of the power supply is coupled to said second current electrode block and a negative lead of said power supply is coupled to said first current electrode block, and a power generator mode of operation wherein said heat source is disposed to provide heat to a portion of said thermoelectric device.

15. The test structure of claim 1 wherein said test structure is provided for testing a device comprising a p-type material section and an n-type wire.

16. The test structure of claim 1 wherein said test structure is provided for testing a device comprising an n-type material section and a p-type wire.

17. The test structure of claim 1 wherein said test structure is provided for testing a device comprising a p-type thermoelectric material section and a p-type wire.

18. The test structure of claim 1 wherein said test structure is provided for testing a device comprising an n-type thermoelectric material section and an n-type wire.

* * * * *

UNITED STATES PATENT AND TRADEMARK OFFICE
CERTIFICATE OF CORRECTION

PATENT NO. : 6,856,136 B2
DATED : February 15, 2005
INVENTOR(S) : Harman

It is certified that error appears in the above-identified patent and that said Letters Patent is hereby corrected as shown below:

Column 1,
Line 39, delete "materials properties" and replace with -- material properties --.

Column 3,
Line 24, delete "voltage source a" and replace with -- voltage source, a --.
Line 56, delete "reverse biased" and replace with -- reverse, biased --.

Column 4,
Line 61, delete "and I a glove box containing an inert atmosphere".

Column 6,
Line 47, delete "P side" and replace with -- P-Side --.
Lines 50 and 53, delete "hot junction" and replace with -- hot-junction --.

Column 7,
Lines 2, 5-6, 20 and 23-24, delete "hot junction" and replace with -- hot-junction --.
Line 44, delete "section" and replace with -- sections --.
Line 62, delete "submitted that that the" and replace with -- submitted that, that the --.

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,856,136 B2 |
| APPLICATION NO. | : 10/152754 |
| DATED | : February 15, 2005 |
| INVENTOR(S) | : Theodore C. Harman |

It is certified that error appears in the above-identified patent and that said Letters Patent is hereby corrected as shown below:

In Column 1, lines 6-9, "Statement Regarding Federally Sponsored Research" section delete the entire paragraph and replace with --This invention was made with government support under Grant No. F19628-95-C-0002 awarded by the US Air Force. The government has certain rights in this invention.--

Signed and Sealed this
Tenth Day of May, 2011

David J. Kappos
*Director of the United States Patent and Trademark Office*